United States Patent
Kim et al.

(10) Patent No.: US 10,403,852 B2
(45) Date of Patent: Sep. 3, 2019

(54) DISPLAY APPARATUS

(71) Applicant: SAMSUNG DISPLAY CO., LTD., Yongin-si, Gyeonggi-do (KR)

(72) Inventors: Changmok Kim, Yongin-si (KR); Jaeho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 17 days.

(21) Appl. No.: 15/141,675

(22) Filed: Apr. 28, 2016

(65) Prior Publication Data

US 2017/0069873 A1    Mar. 9, 2017

(30) Foreign Application Priority Data

Sep. 7, 2015    (KR) .................. 10-2015-0126450

(51) Int. Cl.
*H01L 51/44* (2006.01)
*H01L 51/52* (2006.01)
*H01L 27/32* (2006.01)

(52) U.S. Cl.
CPC ...... *H01L 51/5253* (2013.01); *H01L 27/3223* (2013.01); *H01L 51/525* (2013.01); *H01L 51/5246* (2013.01)

(58) Field of Classification Search
CPC ... H01L 51/525; H01L 51/52; H01L 27/3223; H01L 2224/03011; H01L 2224/11011; H01L 2224/27011; H01L 51/5256; H01L 27/3246; H01L 2933/0083; H01L 27/326; H01L 27/3283; H01L 27/3295; H01L 51/5253; H01L 51/52466; G09G 3/3208; G09G 2300/0413; G02F 2001/133388
See application file for complete search history.

(56) References Cited

U.S. PATENT DOCUMENTS

| | | | |
|---|---|---|---|
| 2002/0047187 A1 | 4/2002 | Nakajima et al. | |
| 2007/0049155 A1 | 3/2007 | Moro et al. | |
| 2014/0217397 A1* | 8/2014 | Kwak | ............... H01L 27/1218 257/43 |
| 2015/0034935 A1* | 2/2015 | Choi | .................. H01L 51/0097 257/40 |

(Continued)

FOREIGN PATENT DOCUMENTS

| | | |
|---|---|---|
| KR | 2002-0018618 A | 3/2002 |
| KR | 10-2008-0087257 A | 10/2008 |
| KR | 10-2015-0014809 A | 2/2015 |

*Primary Examiner* — Daniel Whalen
*Assistant Examiner* — Suberr Chi
(74) *Attorney, Agent, or Firm* — Lewis Roca Rothgerber Christie LLP

(57) ABSTRACT

A display apparatus includes a substrate having a display area and a peripheral area outside the display area, a dam in the peripheral area, a first inorganic layer located in both the display area and the peripheral area and covering the dam, an upper surface of the first inorganic layer being nonplanar, and a roughness of the upper surface at a first part of the first inorganic layer outside the dam being greater than a roughness of the upper surface near a center of the display area, an organic layer covering the first inorganic layer in the display area and a portion of the peripheral area, and a second inorganic layer located in both the display area and the peripheral area and covering the dam and the organic layer.

9 Claims, 8 Drawing Sheets

(56) References Cited

U.S. PATENT DOCUMENTS

| | | | |
|---|---|---|---|
| 2015/0060786 A1* | 3/2015 | Kwak | H01L 51/5253 257/40 |
| 2015/0228927 A1* | 8/2015 | Kim | H01L 51/5203 257/40 |
| 2016/0285038 A1* | 9/2016 | Kim | H01L 51/5237 |
| 2016/0285044 A1* | 9/2016 | Park | H01L 51/5253 |

* cited by examiner

DISPLAY APPARATUS

CROSS-REFERENCE TO RELATED APPLICATION

This application claims priority to and the benefit of Korean Patent Application No. 10-2015-0126450, filed on Sep. 7, 2015, in the Korean Intellectual Property Office, the disclosure of which is incorporated herein in its entirety by reference.

BACKGROUND

1. Field

One or more exemplary embodiments relate to a display apparatus.

2. Description of the Related Art

A display apparatus includes a plurality of display devices arranged in a display area of a substrate. Because the display devices may be easily damaged by oxygen, moisture, or the like, a protective layer for protecting the display devices from oxygen, moisture, or the like from the outside is desired.

However, in existing display apparatuses, although a protective layer covers the display devices, the display devices may still be easily damaged due to infiltration of oxygen, moisture, or the like from the outside into the display area.

SUMMARY

One or more exemplary embodiments include a display apparatus for preventing or reducing the occurrence of a defect due to impurities from the outside.

Additional aspects will be set forth in part in the description which follows and, in part, will be apparent from the description, or may be learned by practice of the presented embodiments.

According to one or more exemplary embodiments, a display apparatus includes a substrate having a display area and a peripheral area outside the display area, a dam in the peripheral area, a first inorganic layer located in the display area and the peripheral area and covering the dam, an upper surface of the first inorganic layer being nonplanar, and a roughness of the upper surface at a first part of the first organic layer outside the dam being greater than a roughness of the upper surface near a center of the display area, an organic layer covering the first inorganic layer in the display area and a portion of the peripheral area, and a second inorganic layer located in the display area and the peripheral area and covering the dam and the organic layer.

The second inorganic layer may contact an end portion of the first inorganic layer, the end portion being outside of the first part of the first inorganic layer.

A roughness of the upper surface at a second part of the first inorganic layer adjacent to an inner side of the dam may be greater than the roughness of the upper surface of the first inorganic layer near the center of the display area.

A roughness of the upper surface at a third part of the first inorganic layer on the dam may be greater than the roughness of the upper surface of the first inorganic layer near the center of the display area.

An upper surface of the organic layer in the display area may be substantially planar.

The first part of the first inorganic layer may surround the display area.

The organic layer may extend up to the first part of the first inorganic layer.

According to one or more exemplary embodiments, a display apparatus includes a substrate having a display area and a peripheral area outside the display area, a dam in the peripheral area, a plurality of first dummy patterns in the peripheral area and located outside of the dam, a first inorganic layer located in the display area and the peripheral area and covering the dam and the plurality of first dummy patterns, an upper surface of a first part of the first inorganic layer covering the plurality of first dummy patterns and having an uneven shape, an organic layer covering the first inorganic layer in the display area and a portion of the peripheral area, and a second inorganic layer located in the display area and the peripheral area and covering the dam and the organic layer.

Each of the plurality of first dummy patterns may extend along an edge of the display area.

The second inorganic layer may contact an end portion of the first inorganic layer, the end portion being outside of the first part of the first inorganic layer.

The display apparatus may further include a plurality of second dummy patterns in the peripheral area such that the plurality of second dummy patterns are adjacent to an inner side of the dam, wherein a second part of the first inorganic layer may have an uneven upper surface covering the plurality of second dummy patterns.

An upper surface of the organic layer in the display area may be substantially planar.

The plurality of first dummy patterns may surround the display area.

The organic layer may extend up to the first part of the first inorganic layer.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Figure 1:
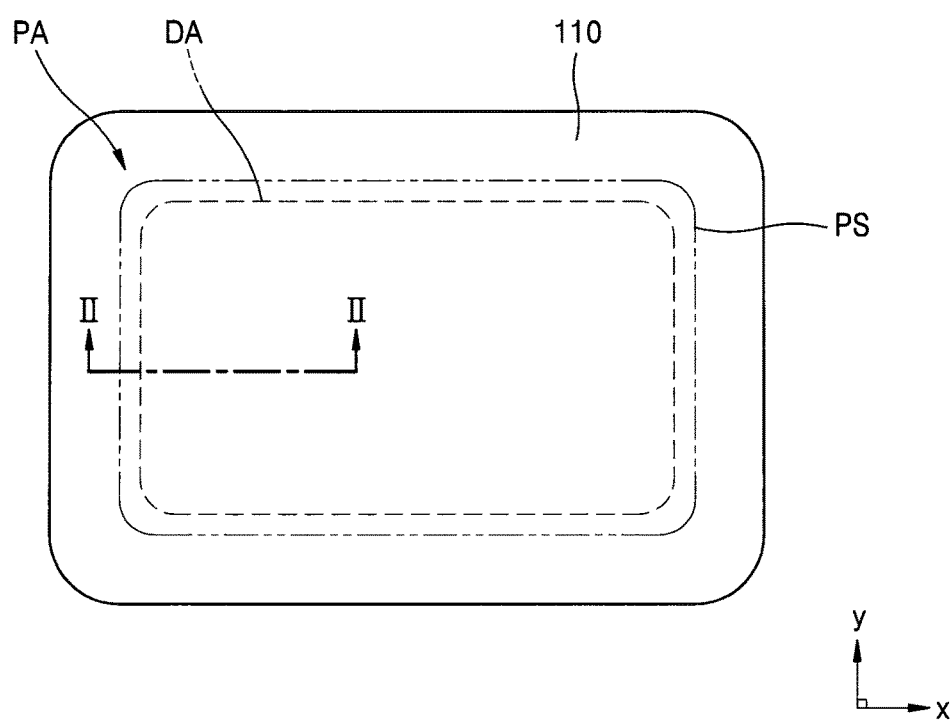
FIG. 1 illustrates a top view of a display apparatus according to one or more exemplary embodiments.

Hereinafter, example embodiments will be described in more detail with reference to the accompanying drawings, in which like reference numbers refer to like elements throughout, and thus their repetitive description may be omitted. In this regard, the present exemplary embodiments may have different forms and should not be construed as being limited to the descriptions set forth herein. Accordingly, the exemplary embodiments are merely described below, by referring to the figures, to explain aspects of the present description.

It will be understood that, although the terms "first," "second," "third," etc., may be used herein to describe various elements, components, regions, layers and/or sections, these elements, components, regions, layers, and/or sections should not be limited by these terms. These terms are used to distinguish one element, component, region, layer or section from another element, component, region, layer, or section. Thus, a first element, component, region, layer, or section described below could be termed a second element, component, region, layer, or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when a layer, region, or component is referred to as being "on" or "connected to" another layer, region, or component, it can be directly or indirectly on or connected to the other layer, region, or component. That is, for example, intervening layers, regions, or components may be present. In addition, it will also be understood that when an element or layer is referred to as being "between" two elements or layers, it can be the only element or layer between the two elements or layers, or one or more intervening elements or layers may also be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
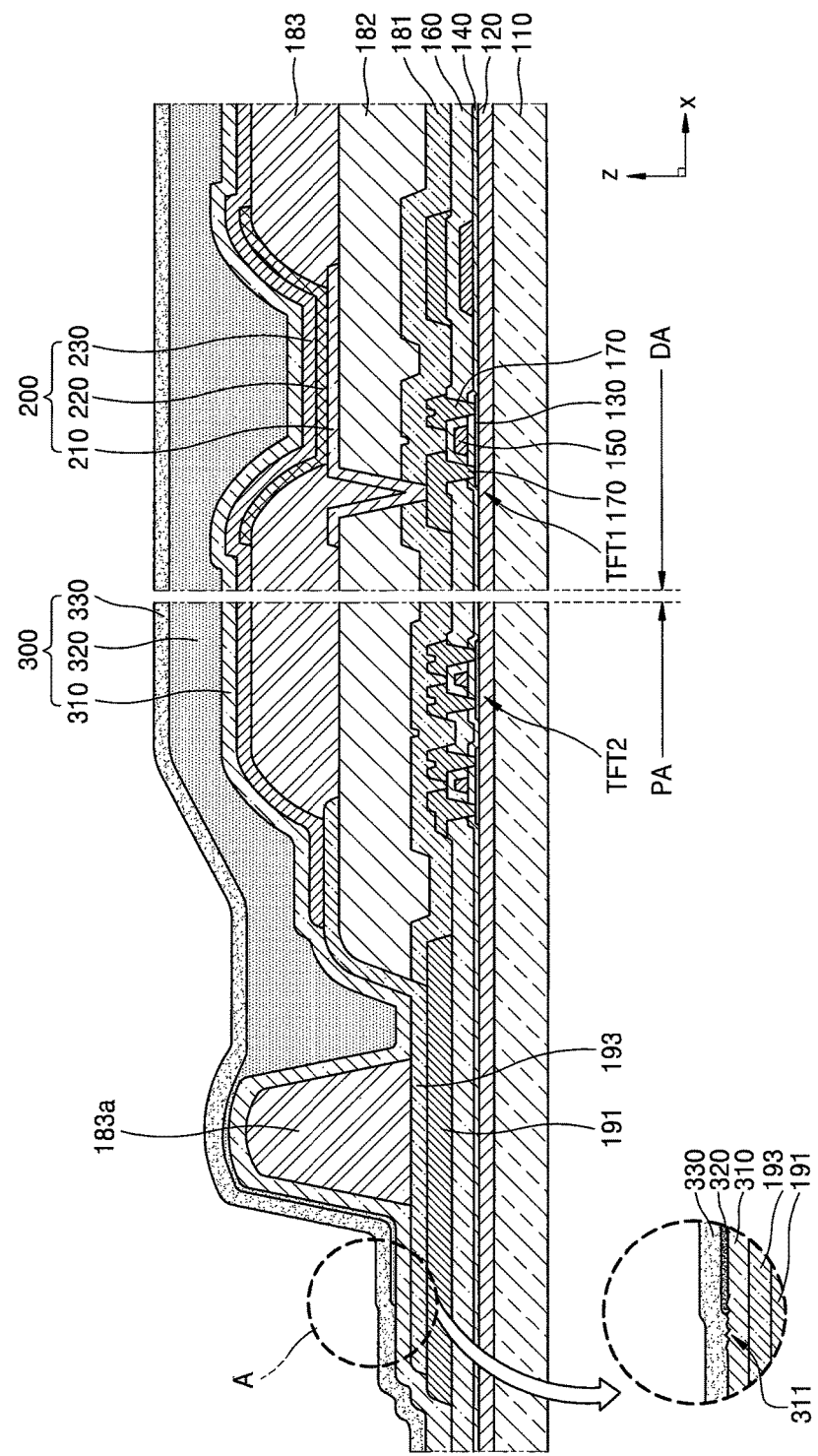
FIG. 2 illustrates a cross-sectional view taken along the line II-II of FIG. 1.

FIG. 1 illustrates a top view of a display apparatus according to one or more exemplary embodiments, and FIG. 2 illustrates a cross-sectional view taken along the line II-II of FIG. 1. FIG. 2 shows an organic light-emitting display apparatus including an organic light-emitting device 200.

The display apparatus according to one or more exemplary embodiments may include a substrate 110 having a display area DA in which organic light-emitting devices 200 are placed as display devices, and a peripheral area PA around the display area DA as a non-display area. The substrate 110 may be formed of various materials, such as a glass material, a metallic material, a plastic material, and the like.

A plurality of first thin-film transistors TFT1 are arranged in the display area DA, and the organic light-emitting devices 200 may be respectively electrically connected to the plurality of first thin-film transistors TFT1 and arranged in the display area DA. It is to be understood that the electrical connection of the organic light-emitting devices 200 to the plurality of first thin-film transistors TFT1 may include respective electrical connection of a plurality of pixel electrodes 210 to the plurality of first thin-film transistors TFT1. A second thin-film transistor TFT2 may also be disposed in the peripheral area PA of the substrate 110. The second thin-film transistor TFT2 may be, for example, a portion of a circuit unit for controlling an electrical signal to be applied to the inside of the display area DA.

Each of the plurality of first thin-film transistors TFT1 and the second thin-film transistor TFT2 may include a semiconductor layer 130 including an amorphous silicon material, a polycrystalline silicon material, and/or an organic semiconductor material, a gate electrode 150, and source and drain electrodes 170. A buffer layer 120 including silicon oxide and/or silicon nitride may be on the substrate 110 to planarize a surface of the substrate 110, or to prevent or reduce infiltration of impurities into the semiconductor layer 130. The semiconductor layer 130 may be on the buffer layer 120.

The gate electrode 150 may be on the semiconductor layer 130, and the source and drain electrodes 170 are electrically conductive according to a signal applied to the gate electrode 150. The gate electrode 150 may be formed as a monolayer or a multi-layer including at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), according to desired adhesion to an adjacent layer, surface flatness of a layer to be stacked, processability, and the like. A gate insulating layer 140 including silicon oxide and/or silicon nitride and the like may be interposed between the semiconductor layer 130 and the gate electrode 150 to insulate the semiconductor layer 130 and the gate electrode 150 from each other.

An interlayer insulating layer 160 may be on the gate electrode 150, and the interlayer insulating layer 160 may be formed as a monolayer or a multi-layer structure including, for example, silicon oxide, silicon nitride, or the like.

The source and drain electrodes 170 are on the interlayer insulating layer 160. The source and drain electrodes 170 are electrically connected to the semiconductor layer 130 through contact openings (e.g., contact holes) formed in the interlayer insulating layer 160 and the gate insulating layer 140. The source and drain electrodes 170 may be formed as a monolayer or a multi-layer structure including at least one of, for example, Al, Pt, Pd, Ag, Mg, Au, Ni, Nd, Ir, Cr, Li, Ca, Mo, Ti, W, and Cu, according to desired conductivity and the like.

A protective layer 181, which covers the first thin-film transistors TFT1, may be provided to protect the first thin-film transistors TFT1 and the like. The protective layer 181 may be formed of an inorganic material, e.g., silicon oxide, silicon nitride, silicon oxynitride, or the like. Although the protective layer 181 may be formed as a single layer, as illustrated in FIG. 2, the protective layer 181 may have a multi-layer structure.

A planarization layer 182 may be on the protective layer 181. For example, when the organic light-emitting device 200 is on the first thin-film transistors TFT1, as shown in FIG. 2, the planarization layer 182 may planarize (or substantially planarize) an upper part of the protective layer 181 covering the first thin-film transistors TFT1. The planarization layer 182 may include, for example, an acrylic organic material, benzocyclobutene (BCB), or the like. Although the planarization layer 182 may be formed as a single layer, as illustrated in FIG. 2, the planarization layer 182 may have a multi-layer structure.

In some embodiments, the display apparatus may include both the protective layer 181 and the planarization layer 182, as illustrated in FIG. 2. However, the present invention is not limited thereto, and the display apparatus may include any one of the protective layer 181 and the planarization layer 182.

The organic light-emitting device 200 includes a pixel electrode 210, an opposite electrode 230, and an intermediate layer 220 interposed between the pixel electrode 210 and the opposite electrode 230, and may include an emission layer. The organic light-emitting device 200 may be on the planarization layer 182 in the display area DA of the substrate.

The protective layer 181 and the planarization layer 182 may each define an opening. The openings of the protective layer 181 and the planarization layer 182 may expose at least one of the source and drain electrodes 170 of a respective one of the first thin-film transistors TFT1. The pixel electrode 210 may be formed on the planarization layer 182 and may be electrically connected to the respective one of the first thin-film transistors TFT1 by contacting one of the source and drain electrodes 170 through the openings of the protective layer 181 and the planarization layer 182. The pixel electrode 210 may be a transparent electrode, a translucent electrode, or a reflective electrode. When the pixel electrode 210 is a transparent electrode or a translucent electrode, the pixel electrode 210 may include, for example, indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 210 is a reflective electrode, the pixel electrode 210 may include a reflective layer formed of Ag, Mg, Al, Pt, Pd, Au, Ni, Nd, Ir, Cr, a compound thereof, or the like and a layer formed of ITO, IZO, ZnO, $In_2O_3$, IGO, and/or AZO. However, the present invention is not limited thereto, and the pixel electrode 210 may be variously modified such that the pixel electrode 210 includes various suitable materials and may be formed as a monolayer or a multi-layer structure.

A pixel-defining layer 183 may be on the planarization layer 182. The pixel-defining layer 183 defines a pixel with an opening corresponding to each sub-pixel, e.g., an opening through which at least a center part of the pixel electrode 210 is exposed. In addition, the pixel-defining layer 183 may prevent or reduce the occurrence of arcing or the like at an edge of the pixel electrode 210 by increasing a distance between the edge of the pixel electrode 210 and the opposite electrode 230 on the pixel electrode 210. The pixel-defining layer 183 may be formed of an organic material, e.g., polyimide or the like.

The intermediate layer 220 of the organic light-emitting device 200 may include a low-molecular material or a high-molecular material. When the intermediate layer 220 includes a low-molecular material, the intermediate layer 220 may have a stacked structure including a hole injection layer (HIL), a hole transport layer (HTL), an emission layer (EML), an electron transport layer (ETL), an electron injection layer (EIL), and the like, alone or in combination, and may include various organic materials, including copper phthalocyanine (CuPc), N,N'-di(naphthalene-1-yl)-N,N'-diphenyl-benzidine (NPB), tris-8-hydroxyquinoline aluminum (Alq3), and the like. The layers included in the stacked structure may be formed by vacuum deposition, for example.

When the intermediate layer 220 includes a high-molecular material, the intermediate layer 220 may mostly have a structure including an HTL and an EML. For example, the HTL may include poly(3,4-ethylenedioxythiophene) (PEDOT), and the EML may include a poly-phenylenevinylene (PPV)- or polyfluorene-based high-molecular material or the like. The intermediate layer 220 may be formed by screen printing, inkjet printing, laser induced thermal imaging (LITI), or the like. However, the present invention is not limited thereto, and the intermediate layer 220 may have various suitable structures and/or include one or more of various suitable materials.

The opposite electrode 230 may be disposed at an upper part of the display area DA to cover the display area DA, as shown in FIG. 2. That is, the opposite electrode 230 may be formed in one body for the plurality of organic light-emitting devices 200 to correspond to the plurality of pixel electrodes 210 (e.g., a singular opposite electrode 230 may be applied to the plurality of organic emitting devices 200 each having one pixel electrode 210). The opposite electrode 230 may be disposed in both the display area DA and the peripheral area PA. The opposite electrode 230 may be a transparent electrode, a translucent electrode, or a reflective electrode. When the opposite electrode 230 is a transparent electrode or a translucent electrode, the opposite electrode 230 may include a layer formed of a metal having a small work function, e.g., Li, Ca, lithium fluoride (LiF)/Ca, LiF/Al, Al, Ag, Mg, or a compound thereof, and a transparent or translucent conductive layer including ITO, IZO, ZnO, $In_2O_3$, or the like. When the opposite electrode 230 is a reflective electrode, the opposite electrode 230 may include a layer formed of Li, Ca, LiF/Ca, LiF/Al, Al, Ag, Mg, or a compound thereof. However, the configuration and materials of the opposite electrode 230 are not limited thereto, and the opposite electrode 230 may be variously modified.

An electrode power supply line 191 and a connection line 193 contacting the electrode power supply line 191 may be arranged in the peripheral area PA around the display area DA of the substrate. The opposite electrode 230 may be disposed in both the display area DA and the peripheral area PA and may be electrically connected to the electrode power supply line 191 through the connection line 193 in the peripheral area PA.

The electrode power supply line 191 may be placed at the same layer as the gate electrode 150 of the first thin-film transistor TFT1. That is, the electrode power supply line 191 and the gate electrode 150 may be formed concurrently, and the electrode power supply line 191 may have the same or substantially the same layer structure and may include the same or substantially the same material as the gate electrode 150. The connection line 193 may include the same or substantially the same material as the pixel electrode 210. For example, the connection line 193 and the pixel electrode 210 may be formed concurrently, and the connection line 193 may have the same or substantially the same layer structure and may include the same or substantially the same material as the pixel electrode 210. However, the present invention is not limited thereto, and the opposite electrode 230 may directly contact the electrode power supply line 191 without the connection line 193. Alternatively, the electrode power supply line 191 may be placed on the interlayer insulating layer 160 and may include the same or substantially the same materials as the source and drain electrodes 170.

Figure 3:
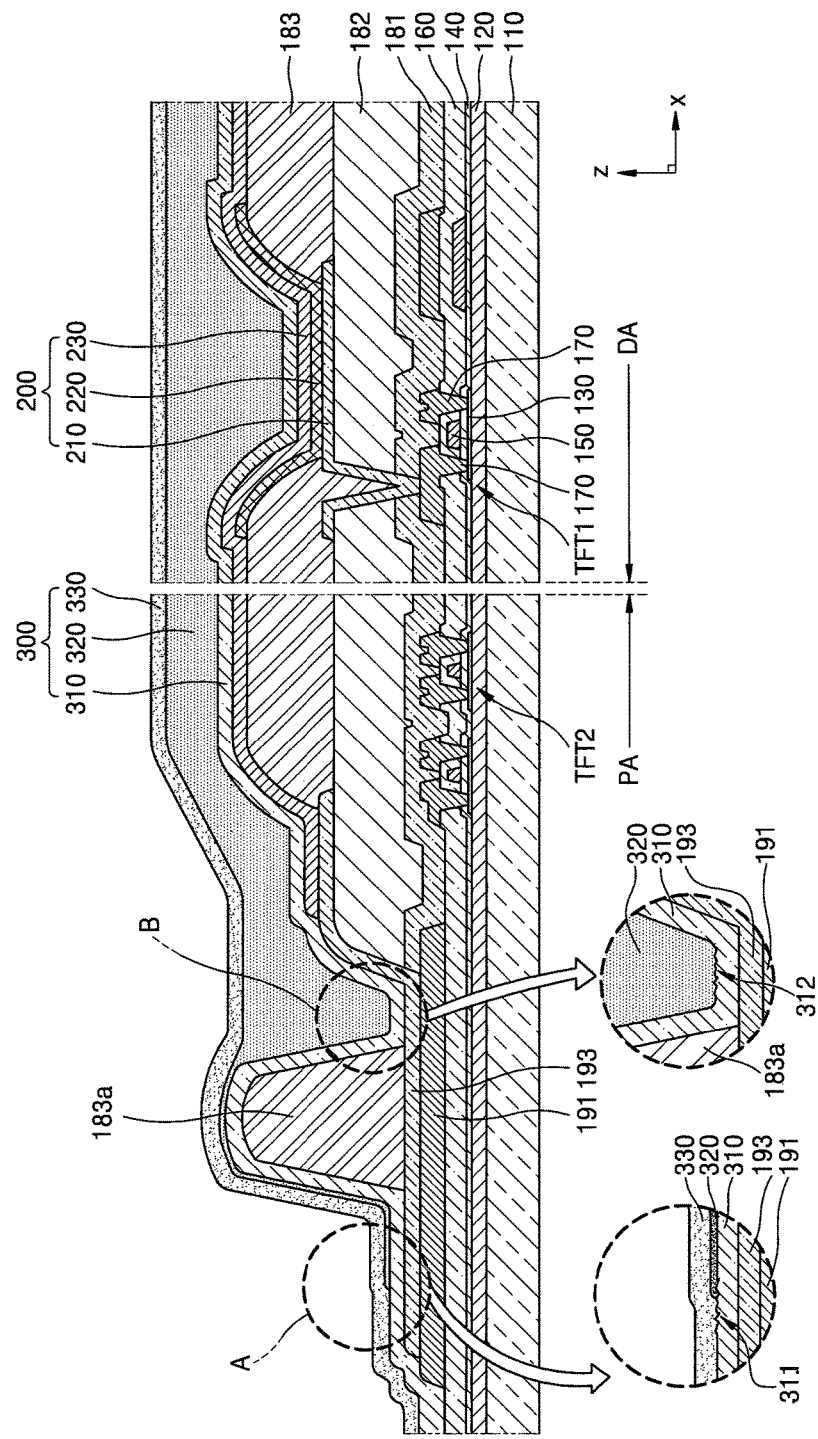
FIG. 3 illustrates a cross-sectional view of a display apparatus according to one or more exemplary embodiments.

A dam 183a may be located in the peripheral area PA of the substrate 110. The dam 183a may have various suitable structures. For example, the dam 183a may have a multi-layer structure. As illustrated in FIG. 3, in some embodiments, the dam 183a may include the same or substantially the same material as the pixel-defining layer 183. For example, the dam 183a and the pixel-defining layer 183 may be formed concurrently, and the dam 183a may have the same or substantially the same layer structure and may include the same or substantially the same material as the pixel-defining layer 183. However, the structure of the dam 183a is not limited thereto, and the dam 183a may be variously modified.

An encapsulation layer 300 may be located in both the display area DA and the peripheral area PA of the substrate 110. The encapsulation layer 300 may prevent the organic light-emitting device 200 from being damaged due to impurities such as oxygen, moisture, and the like from the outside by covering the organic light-emitting device 200 in the display area DA. As shown in FIG. 2, the encapsulation layer 300 may include a first inorganic layer 310, an organic layer 320, and a second inorganic layer 330.

The first inorganic layer 310 is disposed in both the display area DA and the peripheral area PA and covers the dam 183a. The first inorganic layer 310 may include silicon nitride, silicon oxide, and/or the like. The first inorganic layer 310 is formed along a structure having an uneven surface, and thus an upper surface of the first inorganic layer 310 is not planarized (i.e., is nonplanar), as shown in FIG. 2. The organic layer 320 covers the first inorganic layer 310, and an upper surface of the organic layer 320 may be approximately planarized (e.g., may be approximately planar). In more detail, the upper surface of the organic layer 320 may be almost planarized in a portion corresponding to the display area DA. The organic layer 320 may include at least one of polyethylene terephthalate (PET), polyethylene naphthalate (PEN), polycarbonate (PC), polyimide, polyethylene sulfonate, polyoxymethylene, and polyarylate. The second inorganic layer 330 covers the organic layer 320. In more detail, the second inorganic layer 330 may be disposed in both the display area DA and the peripheral area PA and may cover the dam 183a. The second inorganic layer 330 may include, for example, silicon nitride, silicon oxide, or the like.

As described above, the encapsulation layer 300 includes the first inorganic layer 310, the organic layer 320, and the second inorganic layer 330, and thus, even if a crack occurs in the encapsulation layer 300, the multi-layer structure of the encapsulation layer 300 may prevent or reduce the likelihood of the crack spreading between the first inorganic layer 310 and the organic layer 320 or between the organic layer 320 and the second inorganic layer 330. As such, formation of a permeating path of moisture, oxygen, or the like from the outside into the display area DA may be prevented, or likelihood thereof may be reduced.

As shown in a magnified cross-sectional area A of FIG. 2, roughness (e.g., surface roughness along a +z direction) of an upper surface of a first part 311 of the first inorganic layer 310 at an outer side of the dam 183a (e.g., a first part 311 of the first inorganic layer 310 spaced from the dam 183a along a −x direction, as illustrated in FIG. 2), is greater (e.g., rougher or less smooth) than a roughness of the upper surface of the first inorganic layer 310 (e.g., surface roughness along the +z direction) at or near the center of the display area DA. For example, a root mean square (RMS) of the roughness of the upper surface of the first part 311 of the first inorganic layer 310 may be in a range of tens of nanometers (nm) to hundreds of nm. In addition, as described above, the organic layer 320 covers the first inorganic layer 310 in the display area DA, and the organic layer 320 extends along the −x direction to the first part 311 of the first inorganic layer 310.

As described above, the upper surface of the organic layer 320 is almost planarized in the display area DA, and thus the organic layer 320 may substantially planarize an upper part of a structure under the organic layer 320 in the display area DA. A material for forming the organic layer 320 should be capable of being easily spread during a manufacturing process, and thus if the material for forming the organic layer 320 spreads to an outer end of the substrate 110, the first inorganic layer 310 and the second inorganic layer 330 may not contact each other. As such, interfaces between the first inorganic layer 310 and the organic layer 320 and between the organic layer 320 and the second inorganic layer 330 may be exposed to the outside at the outer end of the substrate 110. These interfaces may provide a permeating path through which oxygen, moisture, and the like can permeate into the display area DA from the outside.

Therefore, when the display apparatus shown in FIG. 2 is manufactured, the dam 183a inhibits flow of the material for forming the organic layer 320 so that the material for forming the organic layer 320 does not spread to the outer end of the substrate 110 when the organic layer 320 is formed on the first inorganic layer 310. However, even though the dam 183a is included in the display apparatus, the organic layer 320 may be formed on (or over) the dam 183a, as shown in FIG. 2. Although a thickness of a portion of the organic layer 320 formed over the dam 183a is relatively small (or thin), when the portion of the organic layer 320 formed over the dam 183a extends to the outer end of the substrate 110, the interfaces between the first inorganic layer 310 and the organic layer 320 and between the organic layer 320 and the second inorganic layer 330 are formed as described above, and the interfaces may provide a permeating path through which oxygen, moisture, and the like can permeate into the display area DA from the outside.

However, in the display apparatus according to one or more exemplary embodiments, the roughness of the upper surface of the first part 311 of the first inorganic layer 310, which is outside of the dam 183a, is greater (e.g., the upper surface of the first part 311 of the first inorganic layer 310 is less smooth) than the roughness of the upper surface of the first inorganic layer 310 at (or near) the center of the display area DA. The material for forming the organic layer 320 has a larger contact angle as roughness of a lower layer of the material for forming the organic layer 320 increases, and thus, the material for forming the organic layer 320 may not spread easily as the roughness of the lower layer of the material for forming the organic layer 320 increases. Accordingly, even though a portion of the material for forming the organic layer 320 may spread over the dam 183a when forming the organic layer 320, the material for forming the organic layer 320 may not spread over (or beyond) the first part 311 of the first inorganic layer 310 having relatively high roughness.

Therefore, even if the organic layer 320 spreads over the dam 183a, the organic layer 320 may not spread further than the first part 311 of the first inorganic layer 310, and the organic layer 320 may be effectively prevented from extending to the outer end of the substrate 110 beyond the first part 311 of the first inorganic layer 310. As a result, the second inorganic layer 330 may directly contact the first inorganic layer 310 outside of the first part 311 of the first inorganic layer 310 (e.g., in the −x direction). As such, the interfaces between the first inorganic layer 310 and the organic layer 320 and between the organic layer 320 and the second inorganic layer 330 may not be exposed to the outside at the outer end of the substrate 110, thereby effectively preventing infiltration of oxygen, moisture, and the like into the display area DA from the outside.

The first part 311 of the first inorganic layer 310 may surround (or encircle) the display area DA along a path PS, as shown in FIG. 1. As such, infiltration of impurities into any portion of the display area DA from the outside may be prevented or reduced.

As a reference, increasing roughness of the upper surface of the first inorganic layer 310 at a certain portion relative to the roughness of the upper surface of the first inorganic layer 310 at another portion may be achieved by various methods. For example, the roughness of the certain portion may be increased without increasing the roughness of the other portion by forming the first inorganic layer 310 such that the upper surface of the first inorganic layer 310 has a substantially uniform roughness and then performing a sand blast process on the certain portion. As another example, the first inorganic layer 310 including silicon oxide may be formed using chemical vapor deposition (CVD). As such, a silicon oxide layer is formed by supplying a silicon hydride ($SiH_4$) gas and a nitrogen oxide ($N_2O$) gas, and generally, the $SiH_4$ gas is blocked first in a last stage of forming the silicon oxide layer. However, if all the gases are blocked at the same time, roughness of an upper surface of the silicon oxide layer is large. Therefore, roughness of the certain portion may be greater than roughness of the other portion by first blocking the $SiH_4$ gas for the other portion and blocking all the gases for the certain portion when the first inorganic layer 310 is formed using CVD. This may be achieved by using a mask for shielding a certain region.

As illustrated in FIG. 2, in some embodiments, the first part 311 may be defined as a portion of the first inorganic layer 310 having an upper surface with a greater roughness than the roughness of the upper surface of the first inorganic layer 310 at the center of the display area DA located outside of the dam 183a. However, the present invention is not limited thereto. For example, the first part 311 may be located along the entire outer part of the dam 183a. That is, roughness of the upper surface of the entire portion of the first inorganic layer 310 outside of the dam 183a may be greater than the roughness of the upper surface of the first inorganic layer 310 at the center of the display area DA. This may be applied to the embodiments described below and modifications thereof.

FIG. 3 illustrates a cross-sectional view of a display apparatus according to one or more exemplary embodiments. The display apparatus according to the present exemplary embodiment differs from the display apparatus described above with reference to FIG. 2 in that roughness of a second part 312 of the upper surface of the first inorganic layer 310, which is a part of the first inorganic layer 310 adjacent to the inner side of the dam 183a along a direction of the display area DA (e.g., the +x direction), is greater than the roughness of the upper surface of the first inorganic layer 310 at the center of the display area DA.

As described above, respective roughnesses of the upper surfaces of the first part 311 and the second part 312 of the first inorganic layer 310 are greater than the roughness of the upper surface of the first inorganic layer 310 at the center of the display area DA, and thus an amount of the material for forming the organic layer 320 passing over the second part 312 of the first inorganic layer 310 may be reduced when forming the organic layer 320. As a result, an amount of the material for forming the organic layer 320 that passes over the dam 183a may be reduced. Although the reduced amount is relatively small, the material for forming the organic layer 320 that passes over the dam 183a may not extend beyond the first part 311 of the first inorganic layer 310 of which having a high roughness.

Figure 4:
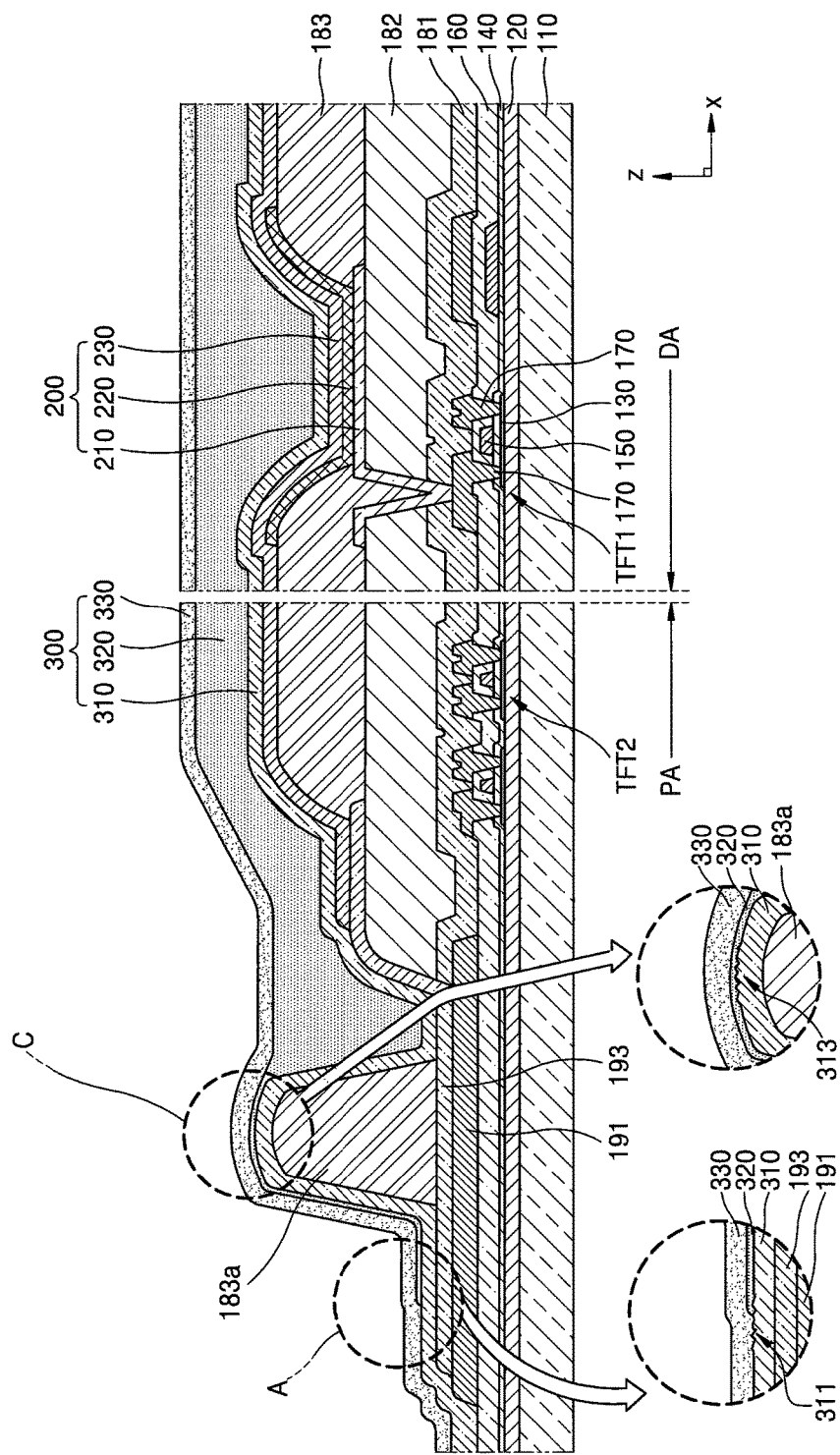
FIG. 4 illustrates a cross-sectional view of a display apparatus according to one or more exemplary embodiments.

FIG. 4 illustrates a cross-sectional view of a display apparatus according to one or more exemplary embodiments.

The display apparatus according to the present exemplary embodiment differs from the display apparatus described above with reference to FIG. 2 in that roughness of an upper surface of a third part 313 of the first inorganic layer 310, which is a portion of the first inorganic layer 310 on the dam 183a, is greater than the roughness of the upper surface of the first inorganic layer 310 at the center of the display area DA.

As described above, respective roughnesses of the upper surfaces of the first part 311 and the third part 313 of first inorganic layer 310 are greater than the roughness of the upper surface of the first inorganic layer 310 at the center of the display area DA, and thus an amount of the material for forming the organic layer 320 that passes over the third part 313 of the first inorganic layer 310, e.g., the dam 183a, may be reduced when forming the organic layer 320. Although the reduced amount is relatively small, the material for forming the organic layer 320 that passes over the dam 183a may not extend beyond the first part 311 of the first inorganic layer 310 having a relatively high roughness.

As another example, in a display apparatus according to one or more exemplary embodiments, respective roughnesses of the upper surfaces of the first part 311, the second part 312, and the third part 313 of the first inorganic layer 310 may be greater than the roughness of the upper surface of the first inorganic layer 310 at the center of the display area DA.

Figure 5:
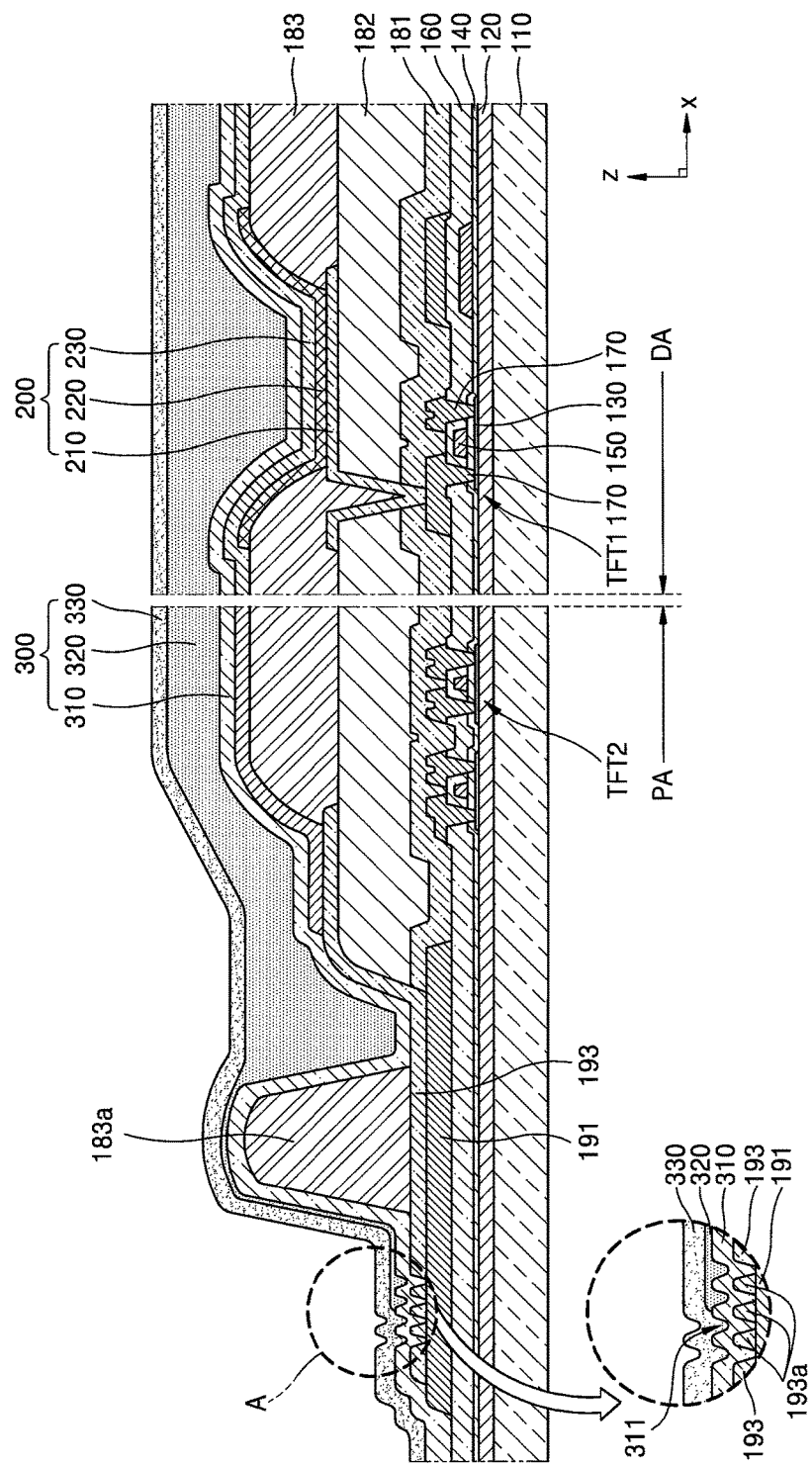
FIG. 5 illustrates a cross-sectional view of a display apparatus according to one or more exemplary embodiments.

FIG. 5 illustrates a cross-sectional view of a display apparatus according to one or more exemplary embodiments. The display apparatus according to the present exemplary embodiment differs from the display apparatus described above with reference to FIG. 2 in that a plurality of first dummy patterns 193a are located at an outer side of the dam 183a in the peripheral area PA. For convenience of description, parts which are not described in the display apparatus according to the present exemplary embodiment are the same as or similar to those described with reference to FIG. 2, and thus additional description thereof is omitted. This also applies to the embodiments described below, and modifications thereof.

As illustrated in FIG. 5, the plurality of first dummy patterns 193a may be located at the same layer as the connection line 193. For example, while forming the connection line 193, the plurality of first dummy patterns 193a may be simultaneously (or concurrently) formed of the same or substantially the same material as that of the connection line 193. The first inorganic layer 310 disposed in both the display area DA and the peripheral area PA and covering the dam 183a also covers the plurality of first dummy patterns 193a, wherein the upper surface of the first inorganic layer 310 at the first part 311 (e.g., in the +z direction) covering the plurality of first dummy patterns 193a has a concave-convex shape (e.g., an uneven shape) because of the plurality of first dummy patterns 193a.

The concave-convex shape of the upper surface of the first inorganic layer 310 at the first part 311 may perform a similar role to the first part 311 of the first inorganic layer 310 having high roughness in the display apparatus described above with reference to FIG. 2. The material for forming the organic layer 320 has a larger contact angle when there is a concave-convex shape on an upper surface of a lower layer as compared to when the concave-convex shape is not formed. As such, the material for forming the organic layer 320 may not easily spread because of the concave-convex shape of the lower layer. Accordingly, even though a portion of the material for forming the organic layer 320 passes over the dam 183a when forming the organic layer 320, the material for forming the organic layer 320 may not extend beyond the first part 311 of the first inorganic layer 310 having the concave-convex shape.

Therefore, even if the organic layer 320 passes over the dam 183a, the organic layer 320 may only extend along the first part 311 of the first inorganic layer 310, and the organic layer 320 may be effectively prevented from extending to the outer end of the substrate 110 over the first part 311. As such, the second inorganic layer 330 may directly contact the first inorganic layer 310 outside of the first part 311 (e.g., in the −x direction) of the first inorganic layer 310. Thus, the interfaces between the first inorganic layer 310 and the organic layer 320 and between the organic layer 320 and the second inorganic layer 330 may not be exposed to the outside at the outer end of the substrate 110, thereby effectively preventing infiltration of oxygen, moisture, and the like into the display area DA from the outside.

The first part 311 of the first inorganic layer 310 may surround (or encircle) the display area DA along the path PS, as shown in FIG. 1. In more detail, each of the plurality of first dummy patterns 193a may extend along a periphery or an edge of the peripheral area PA. For example, referring to FIG. 5, each of the plurality of first dummy patterns 193a may extend along a y-axis direction. As such, infiltration of impurities into any portion of the display area DA from the outside may be prevented or reduced.

Figure 6:
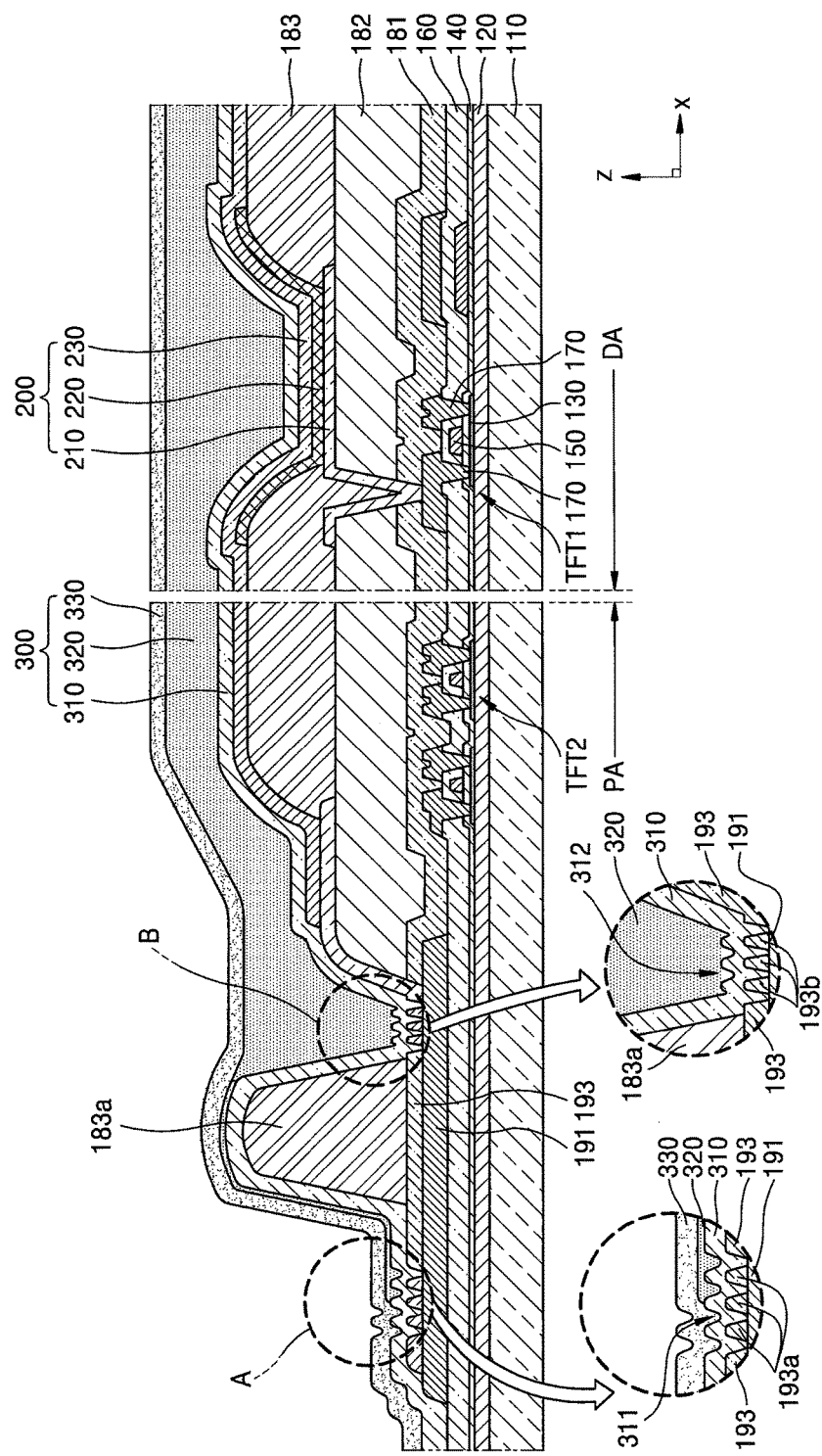
FIG. 6 illustrates a cross-sectional view of a display apparatus according to one or more exemplary embodiments.

FIG. 6 illustrates a cross-sectional view of a display apparatus according to one or more exemplary embodiments. The display apparatus according to the present exemplary embodiment differs from the display apparatus described above with reference to FIG. 5 in that a plurality of second dummy patterns 193b are provided in the peripheral area PA such that the plurality of second dummy patterns 193b are located adjacent to an inner side of the dam 183a along the direction of the display area DA (+x direction), and thus the upper surface of the second part 312 of the first inorganic layer 310 also has a concave-convex shape (e.g., an uneven shape) covering the plurality of second dummy patterns 193b.

As described above, the first part 311 and the second part 312 of the first inorganic layer 310 both have a concave-convex shaped upper surface, and thus an amount of the material for forming the organic layer 320 that passes over the second part 312 of the first inorganic layer 310 may be reduced. As a result, this may reduce an amount of the material for forming the organic layer 320 passing over the dam 183a. Although the reduced amount of material is relatively small, the material for forming the organic layer 320 may not extend beyond the first part 311 of the first inorganic layer 310, having a relatively high roughness.

Figure 7:
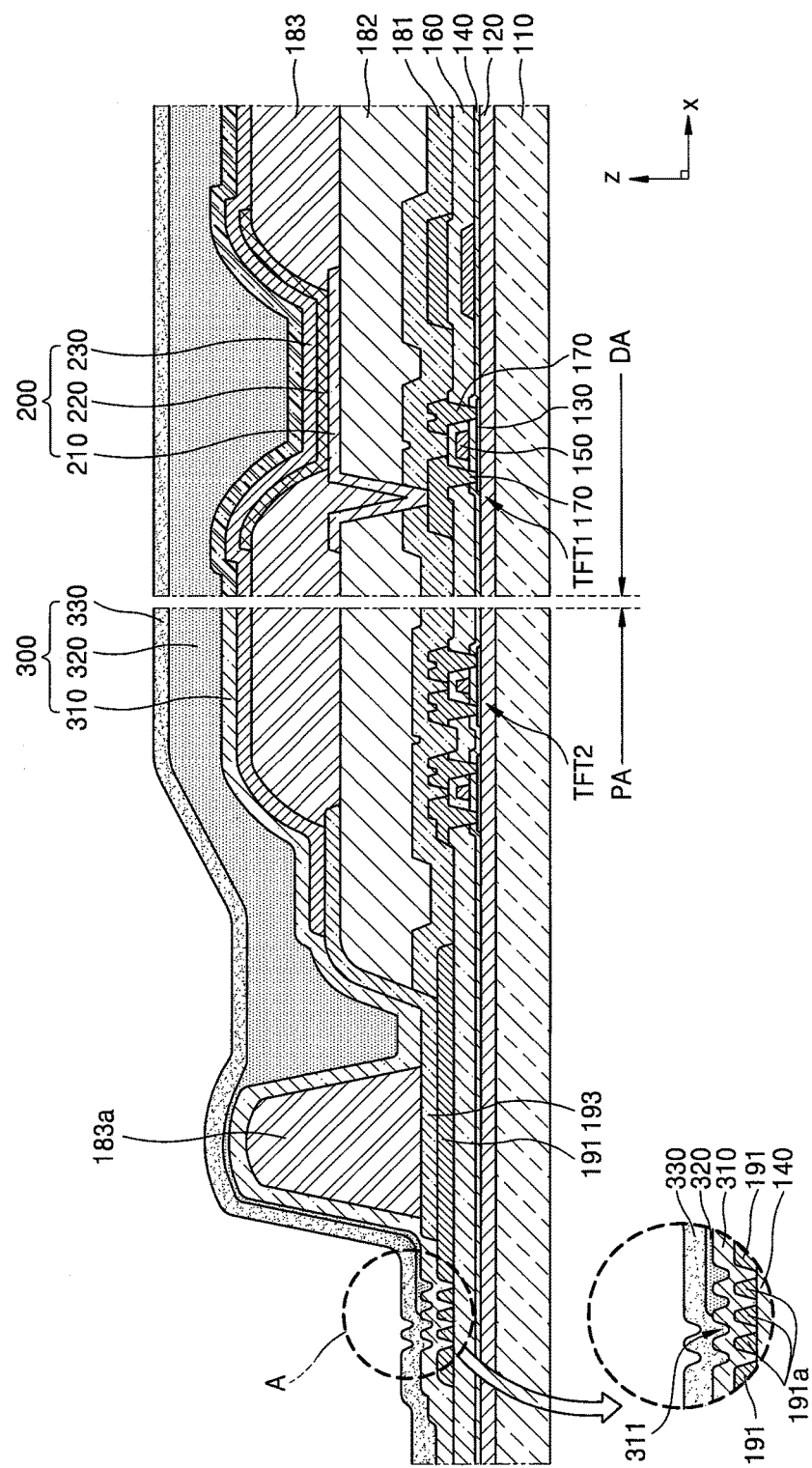
FIG. 7 illustrates a cross-sectional view of a display apparatus according to one or more exemplary embodiments.

Although the plurality of first dummy patterns 193a are described as including the same material as the connection line 193, the present invention is not limited thereto. For example, as shown in FIG. 7, which illustrates a cross-sectional view of a display apparatus according to one or more exemplary embodiments, a plurality of first dummy patterns 191a may include the same or substantially the same material as the electrode power supply line 191. For example, the plurality of first dummy patterns 191a may be on the interlayer insulating layer 160 with the electrode power supply line 191 and may include the same or substantially the same material as the source and drain electrodes 170. As such, the connection line 193 may not cover the plurality of first dummy patterns 191a, and the first inorganic layer 310 may cover the plurality of first dummy patterns 191a such that the upper surface of the first part 311 of the first inorganic layer 310 covering the plurality of first dummy patterns 191a has a concave-convex shape (e.g., an uneven shape).

Figure 8:
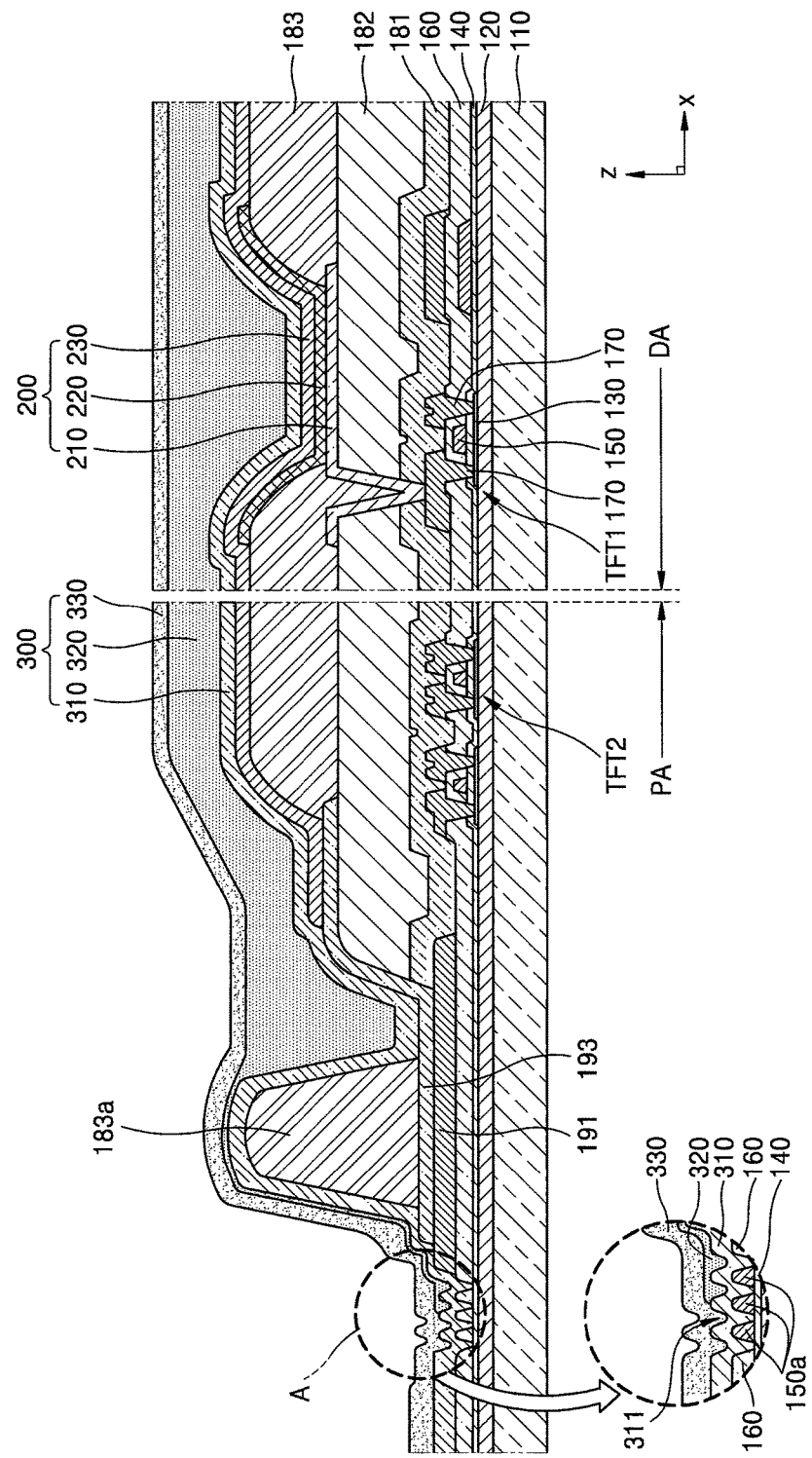
FIG. 8 illustrates a cross-sectional view of a display apparatus according to one or more exemplary embodiments.

However, the present invention is not limited thereto. For example, as shown in FIG. 8, which illustrates a cross-sectional view of a display apparatus according to one or more exemplary embodiments, a plurality of first dummy patterns 150a may be located on the gate insulating layer 140 and may include the same or substantially the same material as the gate electrode 150. As such, the interlayer insulating layer 160 does not cover the plurality of first dummy patterns 150a, and the first inorganic layer 310 may cover the plurality of first dummy patterns 150a such that the upper surface of the first part 311 of the first inorganic layer 310 covering the plurality of first dummy patterns 150a has a concave-convex shape.

According to one or more exemplary embodiments, a display apparatus for preventing or reducing the occurrence of a defect due to impurities from the outside may be implemented. However, the scope of the inventive concept is not limited to this effect.

It will be understood that exemplary embodiments described herein should be considered in a descriptive sense and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
    a substrate having a display area and a peripheral area outside the display area;
    a pixel electrode in the display area;
    a pixel defining layer covering an edge of the pixel electrode;
    a dam in the peripheral area, the dam being spaced apart from the pixel defining layer;
    a plurality of first dummy patterns in the peripheral area and located outside of the dam in a direction facing away from the pixel electrode, the plurality of first dummy patterns not overlapping each other when viewed in a direction perpendicular to the substrate;
    a first inorganic layer located in the display area and the peripheral area and covering the dam and the plurality of first dummy patterns, an upper surface of a first part of the first inorganic layer covering the plurality of first dummy patterns and having an uneven shape;
    an organic layer covering the first inorganic layer in the display area and a portion of the peripheral area; and
    a second inorganic layer located in the display area and the peripheral area and covering the dam and the organic layer,
    wherein an uppermost surface of the plurality of first dummy patterns is lower than an uppermost surface of the dam.

2. The display apparatus of claim 1, wherein each of the plurality of first dummy patterns extends along an edge of the peripheral area.

3. The display apparatus of claim 1, wherein the second inorganic layer contacts an end portion of the first inorganic layer, the end portion being outside of the first part of the first inorganic layer.

4. The display apparatus of claim 1, further comprising a plurality of second dummy patterns in the peripheral area such that the plurality of second dummy patterns are adjacent to an inner side of the dam,
    wherein a second part of the first inorganic layer has an uneven upper surface covering the plurality of second dummy patterns.

5. The display apparatus of claim 1, wherein an upper surface of the organic layer in the display area is substantially planar.

6. The display apparatus of claim 1, wherein the plurality of first dummy patterns surround the display area.

7. The display apparatus of claim 1, wherein the organic layer extends to the first part of the first inorganic layer.

8. The display apparatus of claim 1, wherein the display apparatus further comprises a connection line, and
    wherein the plurality of first dummy patterns are located at a same layer as the connection line.

9. The display apparatus of claim 1, wherein the dam in the peripheral area has a height in a first direction that is orthogonal to the substrate, and the plurality of first dummy patterns each has a height in the first direction that is less than the height of the dam.

* * * * *